(12) United States Patent
Bergenek et al.

(10) Patent No.: US 9,380,652 B2
(45) Date of Patent: Jun. 28, 2016

(54) LIGHTING DEVICE WITH LED CHIP AND PROTECTIVE CAST

(71) Applicant: OSRAM GmbH, Munich (DE)

(72) Inventors: Krister Bergenek, Regensburg (DE); Andreas Biebersdorf, Regensburg (DE); Gertrud Kraeuter, Regensburg (DE); Joerg Sorg, Regensburg (DE); Reiner Windisch, Pettendorf (DE)

(73) Assignee: OSRAM GmbH, Munich (DE)

( * ) Notice: Subject to any disclaimer, the term of this patent is extended or adjusted under 35 U.S.C. 154(b) by 122 days.

(21) Appl. No.: 13/866,052

(22) Filed: Apr. 19, 2013

(65) Prior Publication Data
US 2013/0293097 A1 Nov. 7, 2013

(30) Foreign Application Priority Data

Apr. 23, 2012 (DE) .......................... 10 2012 206 646

(51) Int. Cl.
*H05B 33/02* (2006.01)
*H01L 25/075* (2006.01)
*H01L 33/50* (2010.01)
*H01L 33/56* (2010.01)

(52) U.S. Cl.
CPC ............ *H05B 33/02* (2013.01); *H01L 25/0753* (2013.01); *H01L 33/505* (2013.01); *H01L 33/56* (2013.01); *H01L 2924/0002* (2013.01); *H01L 2933/0091* (2013.01)

(58) Field of Classification Search
USPC .......................... 313/512; 257/79, 98, 99, 100
See application file for complete search history.

(56) References Cited

U.S. PATENT DOCUMENTS

| | | | | |
|---|---|---|---|---|
| 5,367,441 A | * | 11/1994 | Wustlich | ...................... 362/97.1 |
| 7,718,088 B2 | | 5/2010 | Hwang et al. | |
| 2005/0264194 A1 | * | 12/2005 | Ng et al. | ...................... 313/512 |

(Continued)

FOREIGN PATENT DOCUMENTS

| | | |
|---|---|---|
| DE | 102005041260 A1 | 7/2006 |
| DE | 102006028259 A1 | 11/2007 |

(Continued)

OTHER PUBLICATIONS

English language abstract of JP 2010280523 A dated Dec. 16, 2010.

(Continued)

*Primary Examiner* — Ashok Patel
(74) *Attorney, Agent, or Firm* — Viering, Jentschura & Partner mbB

(57) ABSTRACT

The lighting device has at least one LED chip that is potted by means of a potting compound, which potting compound has a light-transmissive, castable and curable matrix material comprising scattering volumes as filler material, wherein the scattering volumes are distributed inhomogeneously over a thickness of the potting compound and these scattering volumes have a lower density than the matrix material in its castable state. A method is used for producing a lighting device, which comprises at least one LED chip, by means of at least the following steps: potting the at least one LED chip by means of a potting compound containing scattering volumes, wherein the scattering volumes have a lower density than a matrix material of the potting compound in this state; curing the potting compound so that an inhomogeneous distribution of the scattering volumes is obtained owing to floating of the scattering volumes in the matrix material.

9 Claims, 3 Drawing Sheets

(56) References Cited

U.S. PATENT DOCUMENTS

| | | |
|---|---|---|
| 2006/0152139 A1 | 7/2006 | Hsieh et al. |
| 2008/0054284 A1* | 3/2008 | Hussell et al. .................. 257/98 |
| 2009/0029131 A1* | 1/2009 | Yeh et al. ...................... 428/215 |
| 2009/0283779 A1* | 11/2009 | Negley et al. .................. 257/88 |
| 2011/0215700 A1* | 9/2011 | Tong et al. ..................... 313/46 |
| 2011/0248287 A1* | 10/2011 | Yuan et al. ..................... 257/88 |
| 2012/0080613 A1* | 4/2012 | Kingsley et al. ........... 250/459.1 |

FOREIGN PATENT DOCUMENTS

| | | |
|---|---|---|
| DE | 102008021658 A1 | 11/2009 |
| DE | 102008022888 A1 | 11/2009 |
| JP | 2010280523 A | 12/2010 |
| WO | 2009135620 A1 | 11/2009 |

OTHER PUBLICATIONS

English language abstract of DE 10 2008 021 658 A1 dated Nov. 5, 2009.

English language abstract of DE 10 2008 022 888 A1 dated Nov. 19, 2009.

* cited by examiner

LIGHTING DEVICE WITH LED CHIP AND PROTECTIVE CAST

RELATED APPLICATIONS

The present application claims priority from German application No.: 10 2012 206 646.2 filed on Apr. 23, 2012.

TECHNICAL FIELD

Various embodiments relate to a lighting device, having at least one LED chip that is potted by means of a potting compound, which potting compound has a light-transmissive, tastable and curable matrix material including scattering volumes as filler material. Various embodiments furthermore relate to a method for producing a lighting device that has at least one LED chip, the method including potting of the at least one LED chip by means of a potting compound containing scattering volumes. The method may be used particularly advantageously for LED modules including a plurality of LED chips emitting light with a different spectral distribution.

BACKGROUND

LED modules including a plurality of LED chips, for example emitting red and blue/yellow or white light, may have a potting compound including scattering bodies contained therein ("scattering encapsulation") for light mixing. It is known to apply the scattering encapsulation layerwise onto an underlying layer of clear potting compound, since, for the scattering encapsulation, with a fixed scattering concentration the following relationships apply: (a) the thicker the scattering encapsulation is, the better the light mixing is and (b) the closer the scattering encapsulation is applied to the LED chips, the worse the light mixing is (since the light then propagates less to the side). Typically, the layering is carried out in such a way that the LED chips are first embedded in the clear potting compound (for example silicone) and the scattering encapsulation (for example aluminum oxide in silicone) is applied on top. This is carried out in two process steps.

The specific configuration of clear potting compound and scattering encapsulation influences in particular the efficiency and the light mixing of the LED module. For good reproducibility, to this end particular measures are necessary, such as staggering of a lateral enclosure used as a potting mold, since otherwise a homogeneous layer thickness of the scattering encapsulation cannot be achieved.

SUMMARY

Various embodiments are provided to at least partially overcome the disadvantages of the prior art, and to provide a simple possibility for efficient light mixing of LED chips.

Various embodiments provide a lighting device, having at least one LED chip that is potted by means of a potting compound, which potting compound has a light-transmissive, castable and curable matrix material including scattering volumes as filler material. The scattering volumes are distributed inhomogeneously over a thickness of the potting compound and have a lower density than the matrix material in its castable state.

The scattering volumes therefore start to float or rise upward immediately after the potting. The effect of this floating movement or rising movement is that there are few scattering volumes per unit volume of the matrix material (lower concentration) in the region of the at least one LED chip and more scattering volumes per unit volume of the matrix material (higher concentration) further away therefrom (particularly in the region of a free surface), and the potting compound is thus demixed in relation to the scattering volumes against the direction of the force of gravity. In this way, the advantages of initially wide light emission with consequent effective light mixing can be achieved. Owing to the spontaneous floating of the scattering volumes, the potting compound may furthermore be introduced in a single step. The provision of filling markings for different potting compounds etc. can be obviated. In particular, the concentration of the scattering volumes may thus vary continuously, which allows particularly homogeneous light distribution and light mixing. Homogeneous light distribution and light mixing are already supported in an LED chip, particularly if this LED chip is a converting LED chip.

The floating comes to an end when, with the curing of the matrix material, its flow resistance, or viscosity, increases. The floating process, and therefore the concentration or distribution of the scattering volumes, may for example be deliberately adjusted or controlled by means of a density difference between the scattering volumes and the matrix material, the initial flow resistance of the matrix material and/or a rate of the curing.

At least one LED chip may be formed as a volume scatterer or as a surface scatterer. The surface scatterer may be formed as a thin film chip. At least one LED chip may be formed as an indium/gallium-based chip, for example as an InGaN chip or InGaAlP chip, in particular as a so-called thinGaN chip. At least one LED chip may be configured as a converting LED chip, the emitter surface of which is covered with at least one wavelength-converting luminescent material. The at least one luminescent material (for example a blue/yellow and/or blue/red converting luminescent material) can convert the (primary) light emitted by the emitter surface (for example blue light) at least partially into light with a longer wavelength (for example yellow or red light). The light emitted by a partially converting LED chip is then, in particular, a mixed light (for example white or warm-white mixed light).

One configuration is that the scattering volumes include air bubbles, or are configured thereas. This allows particularly simple provision of the potting compound. To this end, the potting compound or its matrix material may be supplemented and mixed sufficiently with air bubbles before it is cast.

Another configuration is that the scattering volumes include cavities, or are configured thereas. In this way, a density and/or size of the scattering volumes can be adjusted particularly precisely.

Yet another configuration is that a wall material of the cavities is a reflective material. Its scattering effect is thus achieved by reflection, which allows a particularly high scattering effect.

It is also a configuration that a wall material of the cavities is a light refracting material. Such scattering volumes allow a particularly high light yield and efficiency. The light refracting material may, in particular, be a transparent or translucent material.

The light refracting material may in particular be glass, which can be shaped economically and precisely into hollow spheres. Possible types of hollow glass spheres are available for example from 3M, for example of the type iM30K with a greatest diameter of 30 micrometers and a rated density of 0.6 g/cm$^3$. The light refracting material is not, however, restricted thereto and may for example also include or consist of ceramic or plastic (for example silicone). The hollow glass spheres are furthermore not restricted to the type iM30K, but may purely by way of example also correspond to the types K1, K15, K20, K25, K37, S22, S32LD, S32, S38, S38HS etc. from 3M.

It is furthermore a configuration that the matrix material includes or is silicone or epoxy resin. The silicone preferably has a density of about 1 g/cm$^3$, in particular 1.01 g/cm$^3$. Particularly preferably, hollow glass spheres of the type iM30K are added to the silicone. The configuration is not, however, restricted thereto and may for example also include polyurethane, polyurethane resin, polyurethane acrylate and/or polyacrylate resin as matrix material.

It is furthermore a configuration that the potting compound includes, as a further filler material, luminescent material particles which have a higher density than the matrix material in its castable state. In this way, in the same potting step, settling or sedimentation of the luminescent material may be achieved in the direction of the force of gravity, and therefore, with positioning of the at least one LED chip on the lower side, also covering of the LED chip with the (at least one) luminescent material. This may be advantageous in particular if a plurality of LED chips, for example of the same type, are to be potted and light emitted by these LED chips is intended to be at least partially wavelength-converted by the at least one luminescent material. For example, blue/yellow converting luminescent material may be deposited on LED chips emitting blue light (for example surface-emitting thin film GaN chips, for example InGaN chips). The blue/yellow color mixing, for example to form white mixed light, is then assisted by the scattering volumes.

It is consequently also a configuration that the luminescent material particles have deposited at least partially on the at least one LED chip, because effective and particularly simply implementable wavelength conversion of the primary light emitted by the LED chip can thus be achieved.

It is furthermore a configuration that the at least one LED chip includes a plurality of LED chips, of which at least two LED chips emit light with a different spectral distribution. Various embodiments may be used particularly advantageously in this configuration, because light from different, typically separated LED chips may then also be mixed effectively. The lighting device is not, however, restricted thereto and may also be advantageous, for example, for a plurality of LED chips having light with the same spectral distribution but a spatially inhomogeneous distribution. The lighting device may even be advantageously usable for just one LED chip, for example for color mixing in the case of a converting LED chip and/or for homogenization of a light emission pattern in the case of one or more identical non-converting LED chips as well.

It is a refinement that the LED chips include at least one converting LED chip emitting white mixed light and at least one LED chip emitting red light, which together may in particular generate a warm-white mixed light.

It is also a refinement that the LED chips include at least one converting LED chip emitting greenish-white mixed light and at least one LED chip emitting red, orange or amber light, which together can likewise generate a warm-white mixed light (for example an Osram "Brilliant Mix").

The converting LED chips may, in particular, be InGaN chips or InGaAlP chips covered with a ceramic luminescent material sheet. The non-converting LED chips may, in particular, be bare-die chips.

The LED lighting device may, for example, be formed as an LED module and/or as an LED lamp (optionally including an LED module), or alternatively as an LED light or LED illumination system.

Particularly in a configuration as an LED module, the at least one LED chip may be applied on a carrier serving as the bottom.

The carrier may, for example, be a ceramic substrate and/or a printed circuit board. The LED chips may be enclosed laterally by a circumferential side wall, for example a ring placed on the carrier. The carrier and the side wall may form a potting vessel for the potting compound supplemented with the scattering volumes. This potting vessel then merely needs to be filled with the potting compound up to a desired potting height (in a single potting step).

Various embodiments provide a method for producing a lighting device, which includes at least one LED chip, by means of at least the following steps: (a) potting the at least one LED chip by means of a potting compound containing scattering volumes, wherein the scattering volumes have a lower density than a matrix material of the potting compound in this state, and (b) curing the potting compound so that an inhomogeneous distribution of the scattering volumes is obtained owing to floating of the scattering volumes in the matrix material.

During the potting, the spatial distribution, or the concentration, of the scattering volumes is still at least approximately uniform over the thickness or height of the potting volume, or potting layer. Owing to the density difference between the scattering volumes and the matrix material, and owing to the still low flow resistance, or viscosity, of the matrix material, the scattering volumes rise against the force of gravity ("floating").

For precise influencing of the floating of the scattering volumes, it is a preferred refinement that the curing is externally assisted, for example by controlled exposure of the potting compound, for example to UV light.

It is a configuration that the potting compound contains luminescent material particles, which have a higher density than the matrix material in its state during the potting, and the method includes the following step: curing the potting compound so that, owing to settling of the luminescent material particles in the matrix material, they at least partially cover the at least one LED chip. In this way, in the same single curing step which also determines the distribution of the scattering volumes, coating of the LED chips with (at least one) luminescent material is achieved.

The above-described properties, features and advantages of various embodiments, and the way in which they are achieved, will become more clearly and readily understandable in conjunction with the following schematic description of exemplary embodiments, which will be explained in more detail in conjunction with the drawings. For the sake of clarity, elements which are the same or have the same effect may be provided with the same references.

BRIEF DESCRIPTION OF THE DRAWINGS

In the drawings, like reference characters generally refer to the same parts throughout the different views. The drawings are not necessarily to scale, emphasis instead generally being replaced upon illustrating the principles of the disclosed embodiments. In the following description, various embodiments of the disclosed embodiments are described with reference to the following drawings, in which.

DETAILED DESCRIPTION

The following detailed description refers to the accompanying drawing that show, by way of illustration, specific details and embodiments in which the disclosed embodiments may be practiced.

Figure 1:
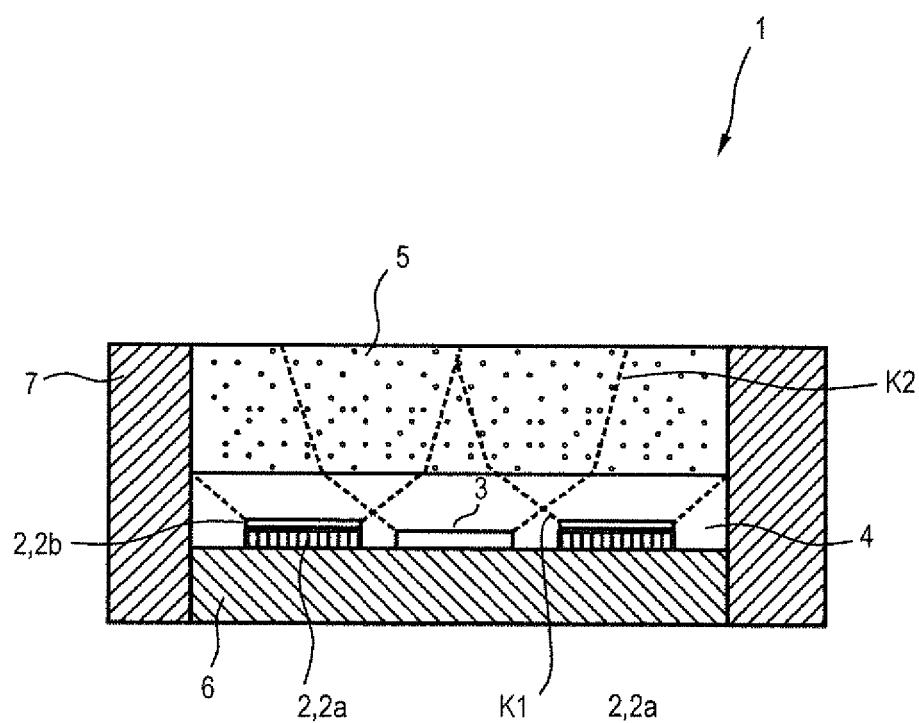
FIG. 1 shows a sectional representation in side view of an LED module in which LED chips are potted in a two-stage potting process, first with a clear potting compound and then with a light-scattering potting compound.

FIG. 1 shows a sectional representation in side view of an LED module 1 in which LED chips 2, 3 are potted in a two-stage potting process, first with a clear potting compound 4 and then with a light-scattering potting compound 5.

The LED chips 2, 3 include converting LED chips 2 emitting greenish-white mixed light. The converting LED chips 2 include a (bare-die) LED chip 2a in the form of a surface-emitting InGaN chip, which is covered with a ceramic blue/green converting luminescent material sheet 2b. The LED chip 3 is an amber LED chip, the LED chips 2, 3 together being capable of forming a white, in particular warm-white, mixed light ("Brilliant Mix").

For the light mixing of the LED chips 2, 3 applied laterally separated from one another on a printed circuit board 6, the light-scattering potting compound 5 is used here. In order to achieve a sufficiently wide light mixing range, the light-scattering potting compound 5 is separated from the LED chips 2, 3 by means of the clear potting compound 4. The clear potting compound 4 directly covers the LED chips 2, 3 and leads to a light cone K1 radiating widely from the LED chips 2, 3, while a light-scattering potting compound 5 directly covering the LED chips 2, 3 would lead to a narrower light cone K2 and therefore less light mixing.

After the wide, or wide-angle, light propagation in the clear potting compound 4, the light, or the light cone K1, strikes the light-scattering potting compound and is consequently mixed therein.

This LED module 1 has the disadvantage that the potting must be carried out in two steps, or stages, namely first filling with the clear potting compound 4 up to a precise first filling level, and then filling with the light-scattering potting compound 5 to a second filling level. To this end, for example, it is possible to use a ring 7 (not shown) that is placed on the printed circuit board 6, laterally with respect to the LED chips 2, 3 and acts as a side wall for the potting compound 4, 5, which ring includes height markings, or the like.

Figure 2:
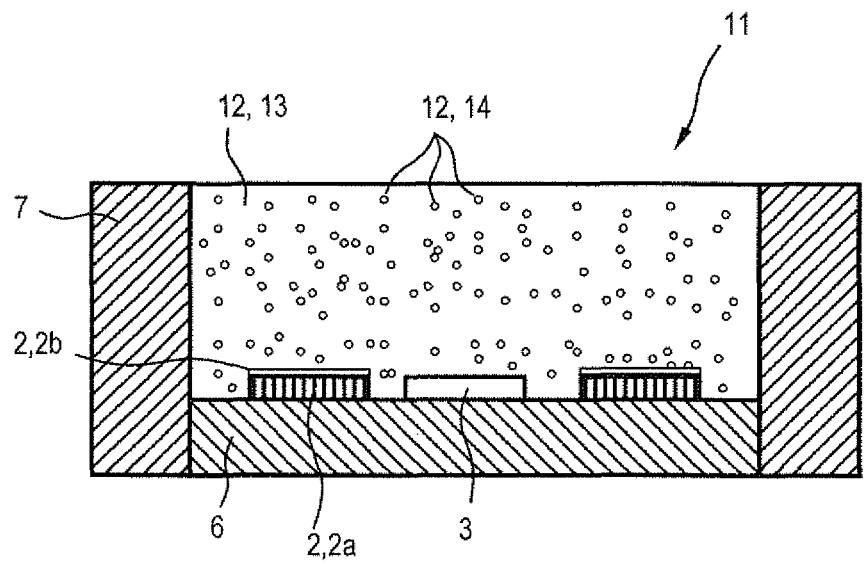
FIG. 2 shows a sectional representation in side view, specifically at the start of the curing, of an LED module in which LED chips are potted with a potting compound in one potting step.

FIG. 2 shows a sectional representation in side view of an LED module 11 in which LED chips 2, 3 are potted with a potting compound 12 in one potting step, and specifically the LED module 11 is shown immediately after filling with the potting compound 12 and therefore at the start of curing which then begins.

During the filling, for example, the potting compound 12 includes scattering volumes, for example hollow glass spheres 14 of the type iM30K from 3M, uniformly distributed in a matrix material, for example consisting of silicone 13.

Since the matrix material 13 still has a comparatively high flowability, or low viscosity, during the filling, owing to their comparatively lower density (about 0.6 g/cm$^3$ compared with about 1 g/cm$^3$ for the silicone 13) the glass spheres 14 in the silicone 13 can rise up against the force of gravity, i.e. 'float'. This takes place rather slowly owing to the fundamentally flow-resistant or viscous nature of the silicone 13. Furthermore, the flow resistance of the silicone 13 increases, and therefore slows the speed of the glass spheres 14, during the filling owing to the curing which then begins.

Figure 3:
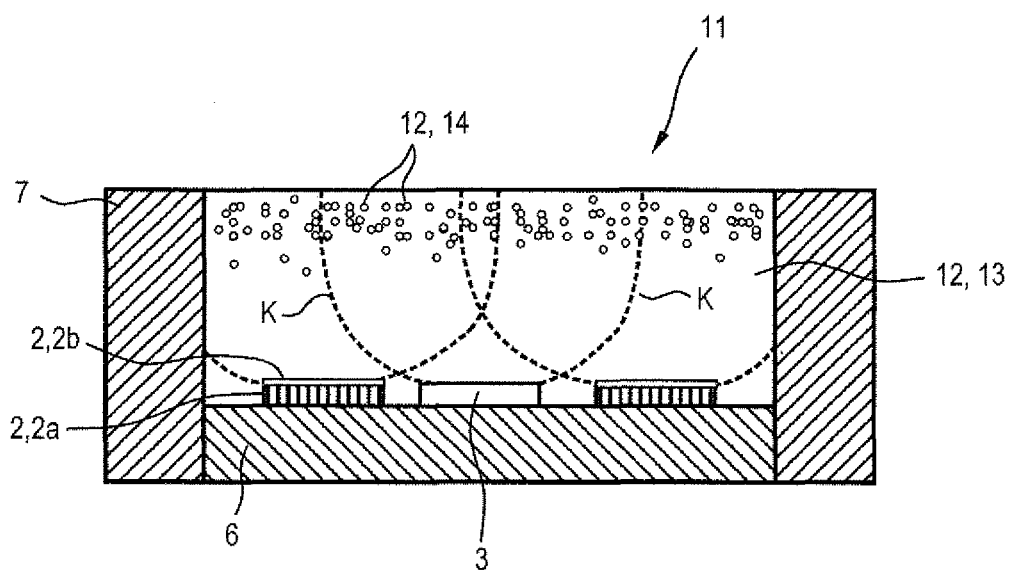
FIG. 3 shows the LED module of FIG. 2 after the curing.

It is therefore possible, as shown in FIG. 3, to provide an LED module 11 with a potting compound 12 which, after the curing (when the movement of the glass spheres 14 in the silicone 13 has come to an end) has an at least essentially continuous distribution or concentration of the glass spheres 14 in the silicone 13. In order to permit initially wide-angle light emission, a region of the potting compound 12 near the LED chips 2, 3, which are arranged on the lower side, is free of glass spheres 14 or has only few glass spheres 14. With an increasing distance or height from the LED chips 2, 3, the number or concentration of the glass spheres 14 increases, in particular continuously or quasi-continuously, and therefore so does the light mixing. Consequently, the apex angle of the light cone K varies continuously. Overall, light mixing effective over a wide area can thus be achieved with a single potting step.

In order to influence the floating in a controlled way, curing of the potting compound 12, or of its silicone 13, may be variably adjustable. For instance, the potting compound 12 may be exposed to UV radiation or IR radiation, in order to carry out the curing more rapidly. In this way, in turn, the concentration of the glass spheres 14, or the distribution thereof over the height of the potting compound 12, can be adjusted in a controlled way.

As an alternative or in addition, the floating may be influenced through the selection of the matrix material viscosity, of the matrix material and/or through the selection of the scattering volumes etc.

Figure 4:
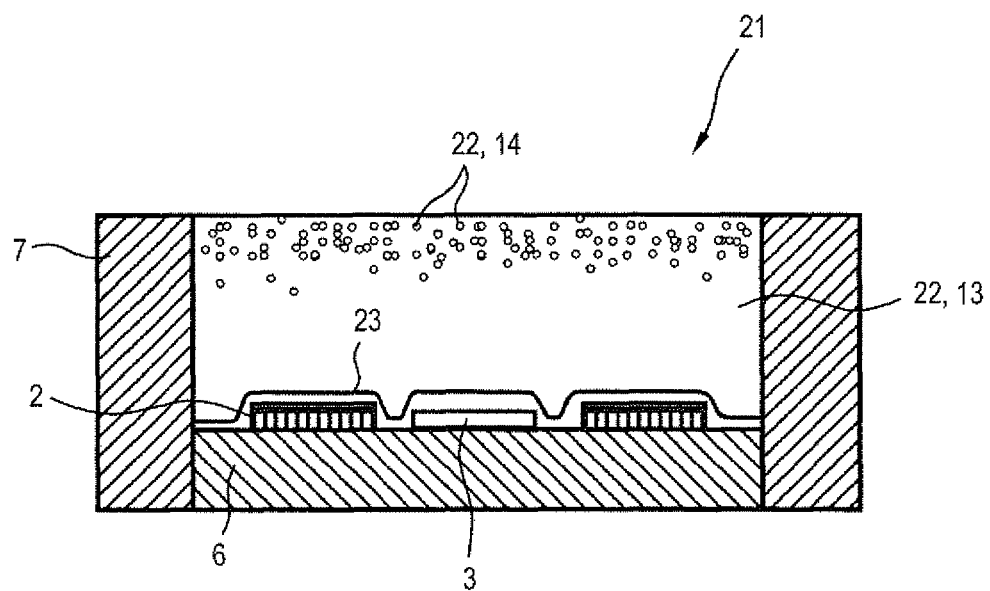
FIG. 4 shows an LED module, similar to FIG. 3, in which the potting compound additionally contains a luminescent material, after the curing.

FIG. 4 shows an LED module 21 similar to FIG. 3, in which the potting compound 22 additionally contains a luminescent material 23, after the curing. The luminescent material 23 has a density which is higher than that of the matrix material, for example silicone 13 with 1.01 g/cm$^3$. During the potting, the luminescent material 23 present in the form of particles thus sinks to the bottom and covers the LED chips 2, 3.

Although various embodiments have been illustrated and described in detail using the exemplary embodiments presented, various embodiments are not restricted thereto and other variants may be derived therefrom by the person skilled in the art, without departing from the protective scope of various embodiments.

For instance, the LED chips may also include converting LED chips 2 emitting white light, which respectively have a blue bare-die chip 2a and an associated blue/yellow converting luminescent material 2b. Furthermore, for example, only such converting LED chips 2 emitting white or blue/yellow mixed light may be provided.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore indeed to be embraced.

LIST OF REFERENCES

1 LED module
2 LED chip
2a bare-die LED chip 2b luminescent material sheet
3 LED chip
4 clear potting compound
5 light-scattering potting compound
6 printed circuit board
7 ring
11 LED module
12 potting compound
13 matrix material
14 scattering volumes
21 LED module
22 potting compound
23 luminescent material particles
K1 light cone
K2 light cone

The invention claimed is:

1. A lighting device having at least one LED chip that is potted by means of a potting compound, which potting compound has a light-transmissive, castable and curable matrix material comprising scattering volumes as filler material,
wherein the scattering volumes are distributed inhomogeneously over a thickness of the potting compound and these scattering volumes have a lower density than the matrix material in its castable state,
wherein the scattering volumes comprise cavities,
wherein a wall material of at least one of the cavities is a reflective material.

2. The lighting device as claimed in claim 1, wherein a wall material of at least one of the cavities is a light refracting material.

3. The lighting device as claimed in claim 1, wherein a wall material of at least one of the cavities comprises or is glass, ceramic or plastic.

4. The lighting device as claimed in claim 1, wherein the matrix material comprises silicone or epoxy resin.

5. The lighting device as claimed in claim 1, wherein the matrix material comprises polyurethane, polyurethane acrylate, polyurethane resin and polyacrylate resin.

6. The lighting device as claimed in claim 1, wherein the potting compound comprises, as a further filler material, luminescent material particles which have a higher density than the matrix material in its castable state.

7. The lighting device as claimed in claim 6, wherein the luminescent material particles have deposited at least partially on the at least one LED chip.

8. The lighting device as claimed in claim 1, wherein the at least one LED chip comprises a plurality of LED chips, of which at least two LED chips emit light with a different spectral distribution.

9. The lighting device as claimed in claim 1, wherein a wall material of at least one of the cavities comprises silicone.

* * * * *